United States Patent
Jeong et al.

(10) Patent No.: US 7,256,419 B2
(45) Date of Patent: Aug. 14, 2007

(54) COMPOSITION FOR FORMING ORGANIC INSULATING FILM AND ORGANIC INSULATING FILM FORMED FROM THE SAME

(75) Inventors: Eun Jeong Jeong, Daejeon-Si (KR); Bon Won Koo, Gyeonggi-Do (KR); Joo Young Kim, Gyeonggi-Do (KR); In Nam Kang, Gyeonggi-Do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 504 days.

(21) Appl. No.: 10/864,469

(22) Filed: Jun. 10, 2004

(65) Prior Publication Data

US 2005/0127355 A1 Jun. 16, 2005

(30) Foreign Application Priority Data

Dec. 11, 2003 (KR) .................. 10-2003-0090309

(51) Int. Cl.
*C07D 207/444* (2006.01)

(52) U.S. Cl. ............. 257/40; 548/549; 257/E51.001

(58) Field of Classification Search ............. 257/40; 438/99; 548/549
See application file for complete search history.

(56) References Cited

U.S. PATENT DOCUMENTS

| | | | |
|---|---|---|---|
| 4,683,275 A * | 7/1987 | Kato et al. ............. | 526/262 |
| 4,983,669 A * | 1/1991 | Piermattie et al. ......... | 525/47 |
| 5,946,551 A | 8/1999 | Dimitrakopoulos et al. | |
| 6,232,157 B1 | 5/2001 | Dodabalapur et al. | |
| 6,849,870 B2 * | 2/2005 | Koo et al. ............. | 257/40 |
| 6,924,008 B2 * | 8/2005 | Takai et al. ............. | 428/1.1 |
| 7,005,674 B2 * | 2/2006 | Lee et al. ............. | 257/40 |

FOREIGN PATENT DOCUMENTS

KR  10-2004-0028010 A  4/2004

OTHER PUBLICATIONS

Marcus Halik et al., "High-mobility organic thin-film transistors based on αα'—didecyloligothiophenes", Journal of Applied Physics, vol. 93, No. 5, Mar. 1, 2003, pp. 2977-2981.

Marcus Halik et al., "Fully patterned all-organic thin film transistors", Applied Physics Letters, vol. 81, No. 2, Jul. 8, 2002, pp. 289-291.

* cited by examiner

*Primary Examiner*—B. William Baumeister
*Assistant Examiner*—Matthew W. Such
(74) *Attorney, Agent, or Firm*—Buchanan Ingersoll & Rooney PC

(57) ABSTRACT

Disclosed herein is a composition for forming an organic insulating film and an organic insulating film formed from the composition. An exemplary composition comprises an insulating polymer having a maleimide structure, a crosslinking agent and a photoacid generator so as to form a crosslinked structure. The organic insulating film has excellent chemical resistance to organic solvents used in a subsequent photolithographic process and can improve the electrical properties of transistors.

8 Claims, 3 Drawing Sheets

COMPOSITION FOR FORMING ORGANIC INSULATING FILM AND ORGANIC INSULATING FILM FORMED FROM THE SAME

BACKGROUND OF THE INVENTION

This non-provisional application claims priority under 35 U.S.C. § 119(a) to Korean Patent Application No. 2003-90309 filed on Dec. 11, 2003, which is herein incorporated by reference.

FIELD OF THE INVENTION

The present invention relates to a composition for forming an organic insulating film, and an organic insulating film formed from the composition. More particularly, the present invention relates to a composition for forming an organic insulating film crosslinked so as to have excellent chemical resistance to organic solvents used in a photolithographic process after formation of the organic insulating film, and an organic insulating film formed from the composition.

DESCRIPTION OF THE RELATED ART

Since polyacetylenes as conjugated organic polymers exhibiting semiconductor characteristics were developed, organic semiconductors have been actively investigated as novel electrical and electronic materials in a wide variety of applications, e.g., functional electronic and optical devices, in terms of various synthetic methods, easy molding into fibers and films, superior flexibility, high conductivity and low manufacturing costs.

Among devices fabricated using these electrically conductive polymers, research on organic thin film transistors fabricated using organic materials as semiconductor active layers has been conducted since the 1980's. In this connection, a number of studies are now being actively undertaken around the world. Organic thin film transistors are substantially identical to silicon (Si) thin film transistors in terms of their structure, but have a great difference in that organic materials are used as semiconductor materials instead of silicon (Si). In addition, such organic thin film transistors have advantages in that they can be fabricated by printing processes at ambient pressure, and further by roll-to-roll processes using plastic as a substrate, instead of conventional silicon processes such as plasma-enhanced chemical vapor deposition (CVD), which is economically advantageous over silicon thin film transistors.

Organic thin film transistors are expected to be useful for driving devices of active displays and plastic chips for use in smart cards and inventory tags, and are comparable to α-Si thin film transistors in their performance. The performance of organic thin film transistors is dependent on the degree of crystallization of organic active layers, charge characteristics at the interfaces between substrates and organic active layers, carrier injection ability into the interfaces between source/drain electrodes and organic active layers. There have been a number of trials to improve the performance of organic thin film transistors. Particularly, in an attempt to decrease a threshold voltage, insulators having a high dielectric constant, for example, ferroelectric insulators, such as $Ba_xSr_{1-x}TiO_3$ (barium strontium titanate (BST)), $Ta_2O_5$, $Y_2O_3$, $TiO_2$, etc., and inorganic insulators, such as $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$, $Bi_4Ti_3O_{12}$, etc., have been used as materials for inorganic insulating films (U.S. Pat. No. 5,946,551). However, these inorganic oxide materials do not have any advantages over conventional silicon materials in terms of processing.

As materials for organic insulating films, polyimide, BCB (benzocyclobutene), photoacryls and the like have been used (U.S. Pat. No. 6,232,157). However, since these organic insulating films exhibit unsatisfactory device characteristics over inorganic insulating films, they are unsuitable to replace inorganic insulating films.

In order to solve these problems, Korean Patent Application No. 2002-59061 describes an insulating polymer having a maleimide copolymer structure which can dramatically improve the performance of organic thin film transistors. However, there still remains a problem that the organic insulating polymer may be dissolved in an organic solvent used in a subsequent photolithographic process. Thus, the present inventors suggested a method for preparing an organic insulator by UV irradiation and annealing a mixture of a crosslinking agent and a photoacid generator.

Similarly, Infineon Technology attempted to improve the chemical resistance in a subsequent process by mixing PVP with polymelamine-co-formaldehyde. However, this attempt is limited in its application to plastic substrates since a high temperature of about 200° C. is required to crosslink PVP (Journal of Applied Physics 2003, 93, 2977 & Applied Physics Letter 2002, 81, 289).

SUMMARY OF THE INVENTION

Therefore, the present invention has been made in view of the above problems, and it is a feature of the present invention to provide an organic insulating film having excellent chemical resistance to organic solvents used in a subsequent photolithographic process. Accordingly, when the organic insulating film is used to fabricate a transistor, it can improve the electrical performance of the transistor while enabling the formation of micropatterns.

In accordance with the feature of the present invention, there is provided a composition for forming an organic insulating film, comprising:

(i) an organic insulating polymer represented by Formula 1 or 2 below:

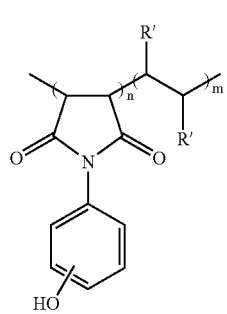

Formula 1 wherein substituents R' are each independently a hydrogen atom, a hydroxyl group, an ester group, an amide group, a $C_{1\sim12}$ alkyl or alkoxy group, a $C_{6\sim30}$ aromatic group, or a $C_{3\sim30}$ heteroaromatic group, the aromatic or heteroaromatic group may be substituted with at least one group selected from hydroxyl, ester, amide, $C_{1\sim12}$ alkyl and alkoxy, and amine groups; n is a real number between 0.1 and 1; m is a real number between 0 and 0.9; and the sum of n and m is 1, or Formula 2

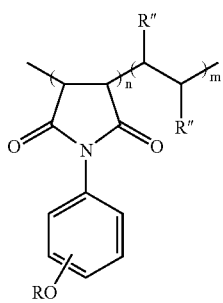

wherein R is a $C_{6\sim30}$ aromatic or $C_{3\sim30}$ heteroaromatic group, the aromatic group and the heteroaromatic group may be substituted with at least one group selected from $C_{1\sim12}$ alkyl and alkoxy, and amine groups; substituents R″ are each independently a hydrogen atom, a hydroxyl group, an ester group, an amide group, a $C_{1\sim12}$ alkyl or alkoxy group, a $C_{6\sim30}$ aromatic group or a $C_{3\sim30}$ heteroaromatic group, the aromatic group and the heteroaromatic group may be substituted with at least one group selected from hydroxyl, ester, amide, $C_{1\sim12}$ alkyl and alkoxy, and amine groups, with the proviso that at least one R″ is a hydroxyl group; n is a real number between 0.1 and 0.9; m is a real number between 0.1 and 0.9; and the sum of n and m is 1;

(ii) a crosslinking agent;

(iii) a photoacid generator; and (iv) a solvent.

In accordance with the feature of the present invention, there is further provided an organic insulating film formed by coating the composition, followed by UV irradiation and annealing.

In accordance with the feature of the present invention, there is yet further provided an organic thin film transistor comprising a substrate, a gate electrode, a gate insulating film, an organic active layer and source-drain electrodes wherein the organic insulating film is used as the gate insulating film.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
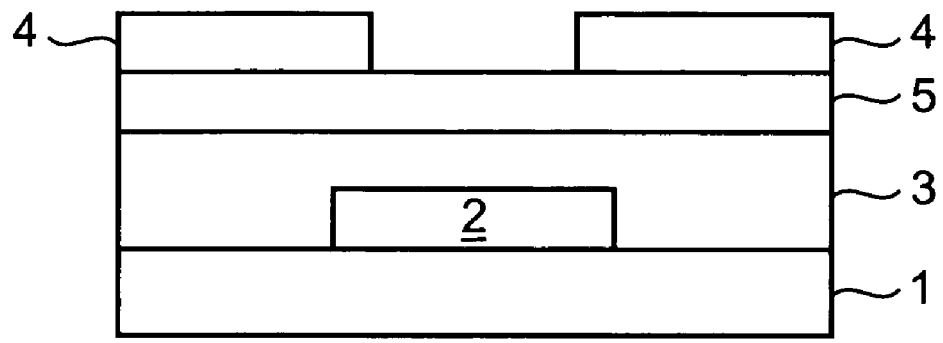
FIGS. 1a and 1b are cross-sectional views schematically showing the structures of general organic thin film transistors.

Hereinafter, the present invention will be explained in more detail.

An organic insulating polymer included in the composition of the present invention is represented by Formula 1 or 2 below:

(1)

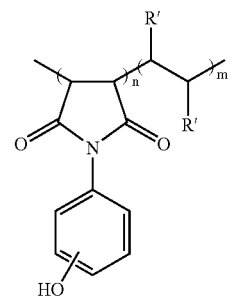

wherein substituents R′ are each independently a hydrogen atom, a hydroxyl group, an ester group, an amide group, a $C_{1\sim12}$ alkyl or alkoxy group, a $C_{6\sim30}$ aromatic group, or a $C_{3\sim30}$ heteroaromatic group, the aromatic group and the heteroaromatic group may be substituted with at least one group selected from hydroxyl, ester, amide, $C_{1\sim12}$ alkyl and alkoxy, and amine groups; n is a real number between 0.1 and 1; m is a real number between 0 and 0.9; and the sum of n and m is 1, or (2)

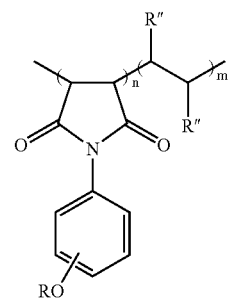

wherein R is a $C_{6\sim30}$ aromatic or $C_{3\sim30}$ heteroaromatic group, the aromatic group and the heteroaromatic group may be substituted with at least one group selected from $C_{1\sim12}$ alkyl and alkoxy, and amine groups; substituents R″ are each independently a hydrogen atom, a hydroxyl group, an ester group, an amide group, a $C_{1\sim12}$ alkyl or alkoxy group, a $C_{6\sim30}$ aromatic group or a $C_{3\sim30}$ heteroaromatic group, the aromatic group and the heteroaromatic group may be substituted with at least one group selected from hydroxyl, ester, amide, $C_{1\sim12}$ alkyl and alkoxy, and amine groups, with the proviso that at least one R″ is a hydroxyl group; n is a real number between 0.1 and 0.9; m is a real number between 0.1 and 0.9; and the sum of n and m is 1.

Besides the organic insulating polymer, the composition of the present invention comprises a crosslinking agent and a photoacid generator in order to cause a crosslinking reaction upon annealing and UV irradiation for the formation of an organic insulating film.

The crosslinking agent included in the composition of the present invention is a material causing a crosslinking reaction upon annealing. Specific examples of crosslinking agents used in the present invention include: epoxy resins; phenol resins; melamine resins; polyacrylic acids; organic acids, such as acetic acid, oxalic acid, butyric acid, tartaric acid, octylic acid, oleic acid, phthalic acid, trimellitic acid, toluenesulfonic acid, styrenesulfonic acid, and the like; amine compounds, such as butylamine, octylamine, laurylamine, dibutylamine, monoethanolamine, diethanolamine, triethanolamine, diethylenetriamine, triethylenetetraamine, olecylamine, cyclohexylamine, benzylamine, diethylaminopropylamine, xylylenediamine, triethylenediamine, guanidine, diphenylguanidine, 4,6-tris(dimethylaminomethyl)phenol, morpholine, N-methylmorpholine, 2-ethyl-4-methylimidazole, 1,8-diazabicyclo[5.4.0]undecene-7, imidazole, and the like; and anhydrides such as maleic anhydride, phthalic anhydride, hexahydrophthalic anhydride, tetrahydrophthalic anhydride, endomethylenetetrahydrophthalic anhydride, dodecylsuccinic anhydride, pyromellitic anhydride, chlorendric anhydride, and the like. These crosslinking agents may be used alone or in combination of two or more thereof.

The crosslinking agent is used in an amount of 10~80 parts by weight, based on 100 parts by weight of the organic insulating polymer. If the amount of the crosslinking agent used exceeds 80 parts by weight, the insulating characteristics are damaged. Meanwhile, if the amount of the crosslinking agent used is less than 10 parts by weight, solvent deterioration is caused.

As to the photoacid generator included in the composition of the present invention, there may be used ionic photoacid generators, non-ionic photoacid generators and polymeric photoacid generators.

Specific examples of ionic photoacid generators used in the present invention include sulfonium- and iodonium-based materials. More specific examples of ionic photoacid generators are materials represented by Formulae 3 to 10 below:

Formula 3

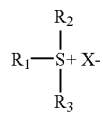

wherein $R_1$, $R_2$ and $R_3$ are each independently a linear or branched $C_{1\sim6}$ alkyl, phenyl or substituted phenylalkyl group; X is a linear, branched or cyclic $C_{1\sim8}$ alkyl sulfonate, perfluoroalkyl sulfonate, naphthyl sulfonate, 10-camphor sulfonate, phenyl sulfonate, tolyl sulfonate, dichlorophenyl sulfonate, trichlorophenyl sulfonate, trifluoromethylphenyl sulfonate, Cl, Br, $SbF_6$, $BF_4$, $PF_6$ or $AsF_6$;

Formula 4

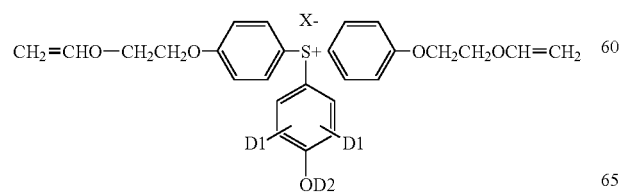

wherein X is a linear, branched or cyclic $C_{1\sim8}$ alkyl sulfonate, perfluoroalkyl sulfonate, naphthyl sulfonate, 10-camphor sulfonate, phenyl sulfonate, tolyl sulfonate, dichlorophenyl sulfonate, trichlorophenyl sulfonate, trifluoromethylphenyl sulfonate, F, Cl, Br, $SbF_6$, $BF_4$, $PF_6$ or $AsF_6$; D1 is a hydrogen atom or a $C_{1\sim4}$ alkyl group; and D2 is a $C_{1\sim10}$ alkyl or 2-vinyloxyethyl group;

Formula 5

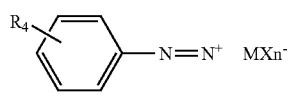

wherein $R_4$ is a $C_{1\sim10}$ alkyl group; and $MX_n^-$ is $BF_4^-$, $PF_6^-$, $AsF_6^-$ or $SbF_6^-$;

Formula 6

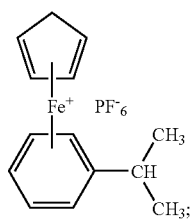

Formula 7

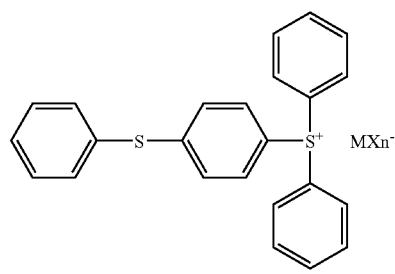

wherein $MX_n^-$ is $PF_6^-$ or $SbF_6^-$;

Formula 8

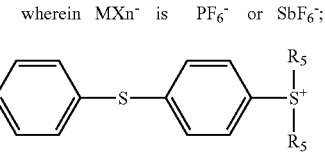

wherein $R_5$ is a $C_{1\sim10}$ alkyl group; and $MX_n^-$ is $PF_6^-$ or $SbF_6^-$;

Formula 9

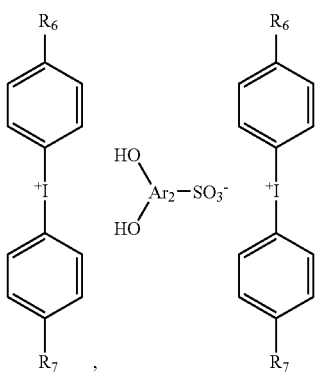

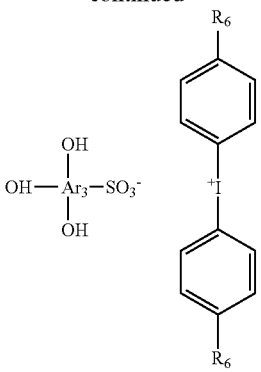

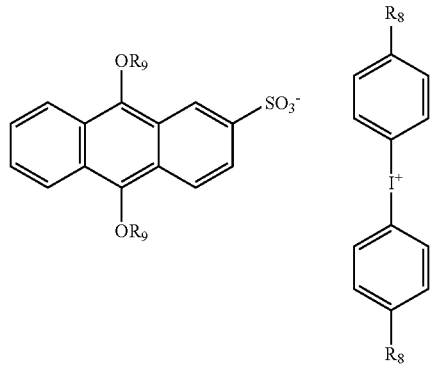

wherein $R_6$ and $R_7$ are each independently a $C_{1\sim20}$ alkyl or an alkoxy group, or a hydroxyl group; and $Ar_1$, $Ar_2$ and $Ar_3$ are each independently a phenyl, naphthalenyl or anthracenyl group; and Formula 10 wherein $R_8$ and $R_9$ are each independently a $C_{1\sim20}$ alkyl or an alkoxy group, or a hydroxyl group.

Specific examples of the material of Formula 3 include triphenylsulfonium trifluoromethanesulfonate, triphenylsulfonium perfluorooctanesulfonate, triphenylsulfonium perfluorobutanesulfonate, diphenyl-p-tolylsulfonium perfluorooctanesulfonate, tris(p-tolyl)sulfonium perfluorooctanesulfonate, tris(p-chlorobenzene)sulfonium trifluoromethanesulfonate, tris(p-tolyl)sulfonium trifluoromethanesulfonate, trimethylsulfonium trifluoromethanesulfonate, dimethylphenylsulfonium trifluoromethanesulfonate, dimethyltolylsulfonium trifluoromethanesulfonate, dimethyltolylsulfonium perfluorooctanesulfonate, triphenylsulfonium p-toluenesulfonate, triphenylsulfonium methanesulfonate, triphenylsulfonium butanesulfonate, triphenylsulfonium n-octanesulfonate, triphenylsulfonium 1-naphthalenesulfonate, triphenylsulfonium 2-naphthalenesulfonate, triphenylsulfonium 10-camphorsulfonate, triphenylsulfonium 2,5-dichlorobenzenesulfonate, diphenyltolylsulfonium 1,3,4-trichlorobenzenesulfonate, dimethyltolylsulfonium p-toluenesulfonate, diphenyltolylsulfonium 2,5-dichlorobenzenesulfonate, triphenylsulfonium tetrafluoroborate, triphenylsulfonium hexafluoroacetate, triphenylsulfonium chloride and the like.

Preferred materials of Formula 4 include those wherein X is methanesulfonate, trifluoromethanesulfonate, p-toluenesulfonate, 10-camphorsulfonate, cyclohexanesulfamate, perfluoro-1-butanesulfonate, perfluorooctanesulfonate, F, Cl, Br, $SbF_6$, $BF_4$, $PF_6$ or $AsF_6$; D1 is a hydrogen atom or a methyl group; and D2 is a methyl or vinyloxyethyl group.

Examples of non-ionic photoacid generators used in the present invention include nitrobenzylsulfonate- and azonaphthoquinone-based materials. More specific examples of the non-ionic photoacid generators are materials represented by Formulae 11 to 17 below:

Formula 11

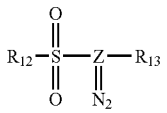

wherein $R_{12}$ and $R_{13}$ are each independently a linear, branched or cyclic $C_{1\sim10}$ alkyl group;

Formula 12

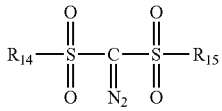

wherein $R_{14}$ is a hydrogen atom, a halogen atom, or a linear or branched $C_{1\sim5}$ alkyl, alkoxy group or a haloalkyl group; and $R_{15}$ is a linear, branched or cyclic $C_{1\sim10}$ alkyl, alkylphenyl or haloalkyl group;

Formula 13

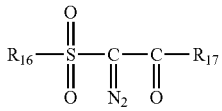

wherein $R_{16}$ is a hydrogen atom, a halogen atom, a linear or branched $C_{1\sim5}$ alkyl group, or a trifluoromethyl group; $R_{17}$ is a linear, branched or cyclic $C_{1\sim10}$ alkyl, alkylphenyl or haloalkyl group, a phenylalkyl group, a linear or branched $C_{1\sim5}$ alkoxy group, a phenyl, or a tolyl group;

Formula 14

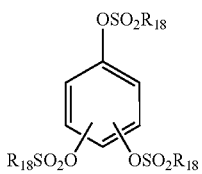

wherein $R_{18}$ is a group represented by Formula 14a or 14b below:

(14a)

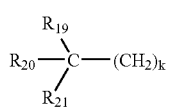

wherein $R_{19}$, $R_{20}$ and $R_{21}$ are each independently a hydrogen or halogen atom; and k is an integer of 0 to 3; or

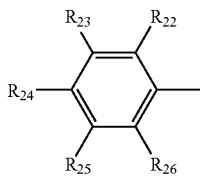
(14b)

wherein $R_{22}$ to $R_{26}$ are each independently a hydrogen atom, a halogen atom, a linear or branched $C_{1\sim5}$ alkyl or alkoxy group, a trifluoromethyl group, a hydroxyl group, a trifluoromethoxy group or a nitro group;

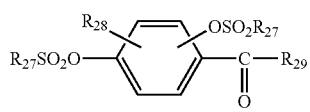
Formula 15 wherein $R_{27}$ is the group of Formula 14a or 14b above; $R_{28}$ is a hydrogen atom, a hydroxyl group or $R_{27}SO_2O$; and $R_{29}$ is a linear or branched $C_{1\sim5}$ alkyl group, or a group represented by Formula 15a below:

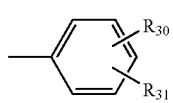
(15a)

wherein $R_{30}$ and $R_{31}$ are each independently a hydrogen atom, a linear or branched $C_{1\sim5}$ alkyl group, or $R_{27}SO_2O$;

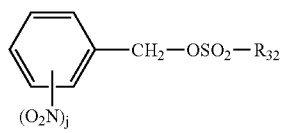
Formula 16 wherein $R_{32}$ is an alkyl or aryl group which may be interrupted by at least one heteroatom; and j is an integer from 1 to 3; and

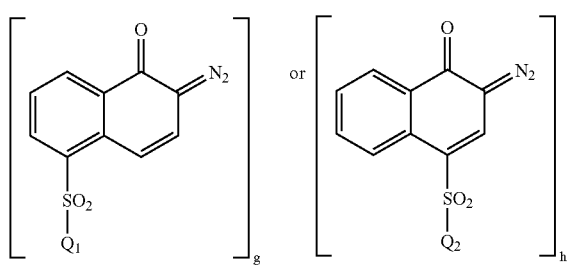
Formula 17 wherein $Q_1$ and $Q_2$ are each independently a $C_{1\sim50}$ alkyl or aryl group, and both g and h are integers not less than 1.

Specific examples of the material of Formula 11 include 1-cyclohexylsulfonyl-1-(1,1-dimethylethylsulfonyl)diazomethane, bis(cyclohexylsulfonyl)diazomethane, 1-cyclohexylsulfonyl-1-cyclohexylcarbonyldiazomethane, 1-diazo -1-cyclohexylsulfonyl-3,3'-dimethylbutan-2-one, 1-diazo-1-methylsulfonyl-4-phenylbutan-2-one, diazo-1-(1, 1-dimethylethylsulfonyl)3,3-dimethyl-2-butanone, 1-acetyl-1-(1-methylethylsulfonyl)diazomethane and the like.

Specific examples of the material of Formula 12 include bis(p-toluenesulfonyl)diazomethane, methylsulfonyl-p-toluenesulfonyldiazomethane, 1-diazo-1-(p-toluenesulfonyl) -3,3'-dimethyl-2-butanone, bis(p-chlorobenzenesulfonyl) diazomethane, cyclohexylsulfonyl-p-toluenesulfonyldiazomethane and the like.

Specific examples of the material of Formula 13 include 1-p-toluenesulfonyl-1-cyclohexylcarbonyldiazomethane, 1-diazo -1-(p-toluenesulfonyl)-3,3-dimethylbutan-2-one, 1-diazo-1-benzenesulfonyl-3,3-dimethylbutan-2-one, 1-diazo-1-(p-toluenesulfonyl) -3-methylbutan-2-one and the like.

Specific examples of the material of Formula 14 include 1,2,3-tris(trifluoromethanesulfonyloxy)benzene, 1,2,3-tris -(2,2,2-trifluoroethanesulfonyloxy)benzene, 1,2,3-tris(2-chloroethanesulfonyloxy)benzene, 1,2,3-tris(p-trifluoro benzenesulfonyloxy)benzene, 1,2,3-tris(p-nitrobenzenesulfonyloxy)benzene, 1,2,3-tris(2,3,4,5-pentafluorobenzenesulfonyloxy)benzene, 1,2,3-tris(p-fluoro benzenesulfonyloxy)benzene, 1,2,3-tris(methanesulfonyloxy)benzene, 1,2,4-tris(p-trifluoromethyloxybenzenesulfonyloxy)benzene, 1,2,4-tris(2,2,2-trifluoroethanesulfonyloxy)benzene, 1,2,4-tris(2-thienylsulfonyloxy)benzene, 1,3,5-tris(methanesulfonyloxy)benzene, 1,3,5-tris(trifluoromethanesulfonyloxy)benzene, 1,3,5-tris(2,2,2-trifluoroethanesulfonyloxy)benzene, 1,3,5-tris(p-nitrobenzenesulfonyloxy)benzene, 1,3,5-tris(2,3,4,5,6-pentafluorobenzenesulfonyloxy)benzene, 1,3,5-tris(p-fluorobenzenesulfonyloxy)benzene, 1,3,5-tris(2-chloroethanesulfonyloxy)benzene and the like.

Specific examples of the material of Formula 15 include 2,3,4-tris(p-fluorobenzenesulfonyloxy)benzophenone, 2,3, 4-tris(trifluoromethanesulfonyloxy)benzophenone, 2,3,4-tris(2-chloroethanesulfonyloxy)benzophenone, 2,3,4-tris(p-trifluoromethylbenzenesulfonyloxy)benzophenone, 2,3,4-tris(p-nitrobenzenesulfonyloxy)benzophenone, 2,3,4-tris(p-fluorobenzenesulfonyloxy)acetophenone, 2,3,4-tris(2,3,4,5, 6-pentafluorobenzenesulfonyloxy)acetophenone, 2,3,4-tris (2-nitrobenzenesulfonyloxy)acetophenone, 2,3,4-tris(2,5-dichlorobenzenesulfonyloxy)acetophenone, 2,3,4-tris(2,3,4-trichlorobenzenesulfonyloxy)acetophenone, 2,2',4,4'-tetra (methanesulfonyloxy)benzophenone, 2,2',4,4'-tetra(2,2,2-trifluoroethanesulfonyloxy)benzophenone, 2,2',4,4'-tetra(2-chloroethanesulfonyloxy)benzophenone, 2,2',4,4'-tetra(2,5-dichlorobenzenesulfonyloxy)benzophenone, 2,2',4,4'-tetra (2,4,6-trimethylbenzenesulfonyloxy)benzophenone, 2,2',4, 4'-tetra(m-trifluoromethylbenzenesulfonyloxy) benzophenone and the like.

The polymeric photo-acid generator is a polymer capable of generating an acid upon light irradiation wherein the polymer has a molecular weight of 500~1,000,000 and contains a sulfonium or iodonium salt in its backbone chain or side chain.

The photoacid generator is used in an amount of 0.1~10 parts by weight, based on 100 parts by weight of the organic insulating polymer. When the amount of the photoacid generator used exceeds 10 parts by weight, there is a problem that the crosslinked mixture is gelled. On the other hand, when the amount of the photoacid generator used is less than 0.1 parts by weight, photosensitivity is poor and thus solvent deterioration of the thin film is caused.

The organic insulating film of the present invention is formed by mixing the organic insulating polymer, the crosslinking agent and the photoacid generator, dissolving the mixture in an organic solvent in such an amount that the solid content is in the range of 1~50% by weight, and coating the solution onto a substrate on which a gate electrode is formed. As the organic solvent, cyclohexanone, diethylene glycol methyl ethyl ether, N-methylpyrrolidinone and the like may be used. The coating may be carried out by spin coating, spin casting, ink-jet printing techniques, etc.

The insulating film is annealed at 90~110° C. for 50~70 minutes and exposed to UV light to form the final organic insulating film. The order of the annealing and UV irradiation may be inverted. In addition, the two processes may be repeatedly carried out one or more times.

The organic insulating film thus formed can be used to fabricate an organic thin film transistor comprising a substrate, a gate electrode, a gate insulating film, an organic active layer and source-drain electrodes. At this time, the organic insulating film is used as the gate insulating film.

Figure 1B:
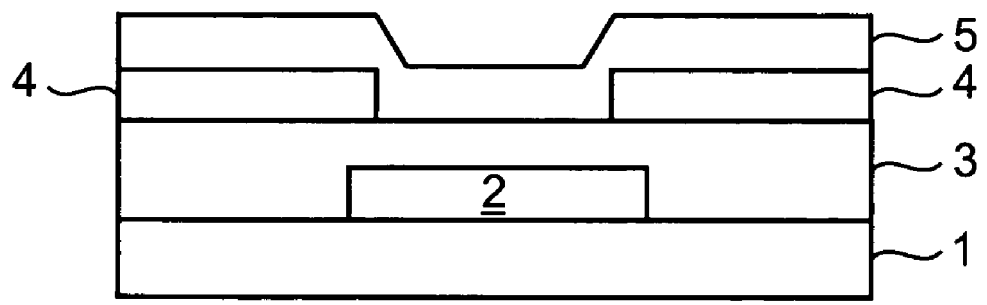

The structures of representative organic thin film transistors are shown in FIGS. 1a and 1b. The organic insulating film of the present invention is applicable to not only the structures shown in FIGS. 1a and 1b, but also all structures already known in the art.

As materials for the organic active layer, any materials commonly used in the art can be used. Examples of suitable materials include, but are not limited to, pentacenes, copper phthalocyanines, polythiophenes, polyanilines, polyacetylenes, polypyrroles, polyphenylene vinylenes and derivatives thereof.

Suitable materials for the gate electrode and the source-drain electrodes are metals and electrically conductive polymers commonly used in the art. Specific examples include, but are not limited to, gold (Au), silver (Ag), aluminum (Al), nickel (Ni), indium-tin oxides (ITOs), polythiophenes, polyanilines, polyacetylenes, polypyrroles, polyphenylene vinylenes, PEDOT (polyethylenedioxythiophene)/PSS (polystyrenesulfonate) and the like.

Materials for the substrate of the organic thin film transistor are, but are not limited to, e.g., glass, silicon wafer, PET, PC, PES, PEN and the like.

Hereinafter, the present invention will be described in more detail with reference to the following preferred examples. However, these examples are given for the purpose of illustration and are not to be construed as limiting the scope of the invention.

PREPARATIVE EXAMPLE 1

Preparation of Organic Insulating Polymer

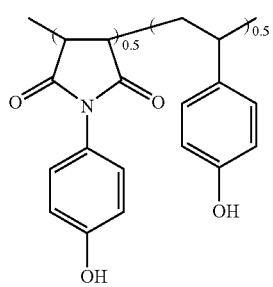

(20)

The organic insulating polymer of Formula 20 above was prepared in accordance with the following procedure.

50 g (0.51 moles) of maleic anhydride (Aldrich) was dissolved in ether (250 mL), and then 50.6 g (0.46 moles) of 4-aminophenol (Aldrich) was added thereto. The resulting mixture was stirred for 30 minutes to obtain a solid as a yellow powder. The solid was dissolved in 100 mL of acetic anhydride (Aldrich), and then 15 g (0.18 moles) of sodium acetate was added thereto. The reaction mixture was heated to 90° C. and reacted for 3 hours. Thereafter, the reaction mixture was allowed to cool, and 500 mL of water was added to quench the reaction. The reaction mixture was filtered, and recrystallized from methanol to obtain 4-acetoxyphenylmaleimide as a dark yellow crystal. After 40 g (0.17 moles) of 4-acetoxyphenylmaleimide, 28.06 g (0.17 moles) of 4-acetoxystyrene (Aldrich), 1.42 g of AIBN (TCI), and 35 drops of 1-dodecanethiol (Aldrich) were sequentially dissolved in 500 mL of acetone, they were polymerized at 65° C. for 3.5 hours. The reaction solution was poured into a mixed solution of methanol and acetone, and then 10 g of p-toluenesulfonic acid (Aldrich) was added thereto. The resulting mixture was refluxed for 5 hours while the solvents were removed using a Dean-Stark trap. After the solvents were removed to some extent, a solution of water and methanol (5:1) was added to the solution to afford 51 g of the polymer of Formula 20 as a white solid.

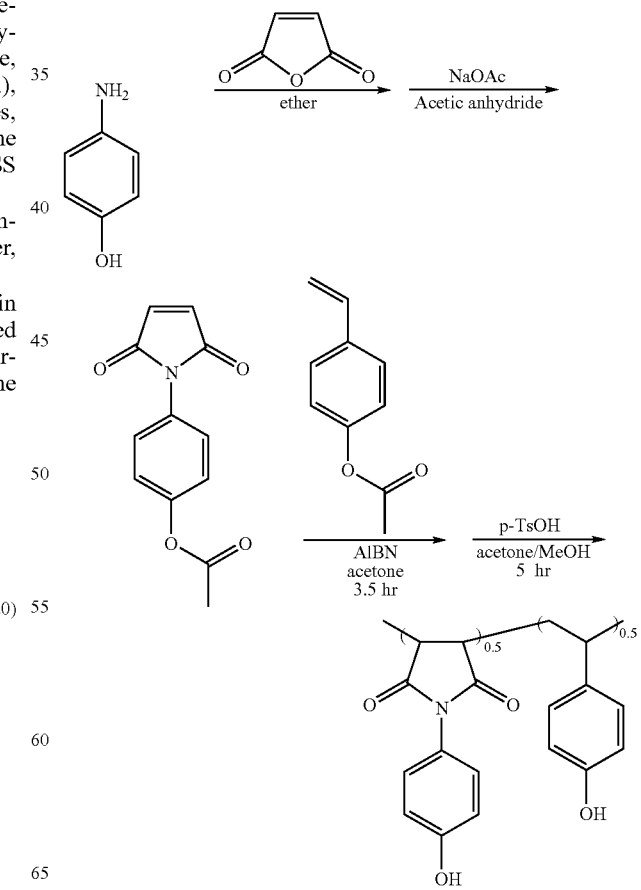

PREPARATIVE EXAMPLE 2

Preparation of Coating Solution for Formation of Organic Insulating Film 7 g of the organic insulating polymer prepared in Preparative Example 1, 1.5 g of poly(ethylene-co-methyl acrylate-co-glycidyl methacrylate) of Formula 21a below (Aldrich) as a crosslinking agent, 1.5 g of poly(ethylene-co-methyl acrylic acid) of Formula 21b below (Aldrich) as another crosslinking agent, and 0.1 g of a photoacid generator of Formula 22 below (PAC200, Miwon Commercial Co. Ltd., Korea) were dissolved in a mixed solution of 73 g of cyclohexanone and 4.5 g of diethylene glycol methyl ethyl ether to prepare a coating solution for the formation of an organic insulating film.

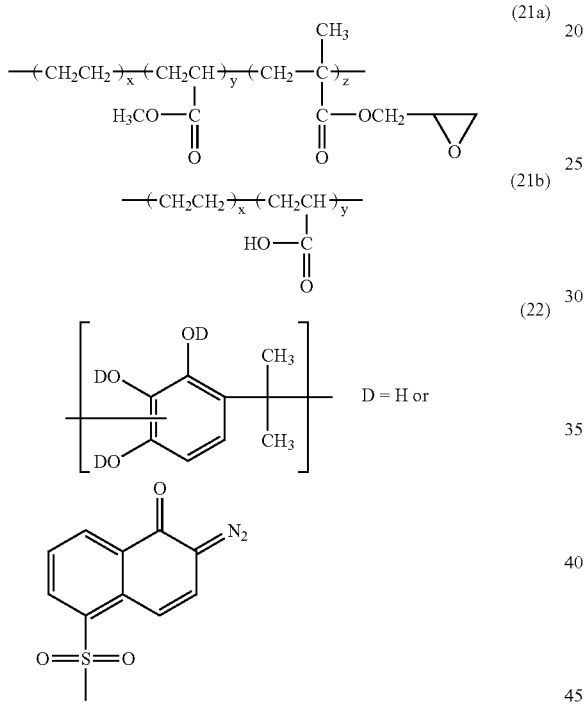

EXAMPLE 1

Fabrication of Organic Thin Film Transistor

In this example, a bottom-contact organic thin film transistor was fabricated (FIG. 1b). First, Al was deposited on a washed glass as a substrate by a vacuum deposition technique to form a gate electrode having a thickness of 1,500 Å. The coating solution for forming an organic gate insulating film, which was prepared in Preparative Example 2, was coated onto the gate electrode to a thickness of 5,000 Å by spin coating at 4,000 rpm, prebaked at 100° C. for 3 minutes, irradiated by 600 W UV for 20 seconds, and baked at 100° C. for 1 hour to form an organic insulating film. Next, Au was deposited on the organic gate insulating film to a thickness of 1,000 Å, and was subjected to a photographic process to form an Au electrode pattern. Pentacene was deposited on the Au electrode pattern to a thickness of 1,000 Å by organic molecular beam deposition (OMBD) under a vacuum of $2 \times 10^{-7}$ torr, a substrate temperature of 50° C. and a deposition rate of 0.85 Å/sec., to fabricate a device.

Figure 2:
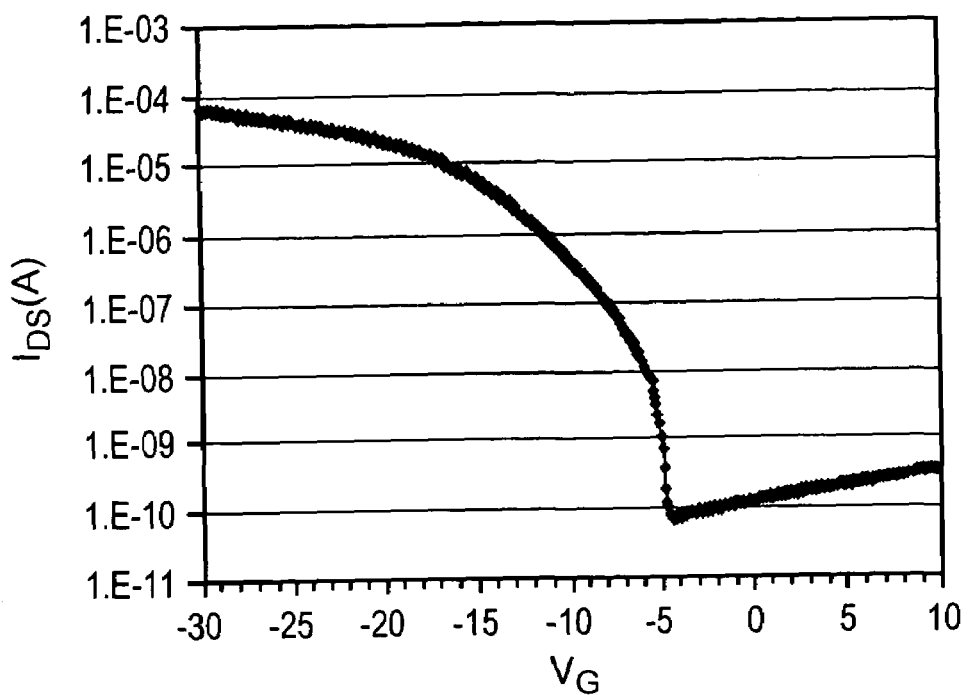
FIG. 2 is a graph showing the current transfer characteristics of a device fabricated according to Example 1 of the present invention.
Figure 3:
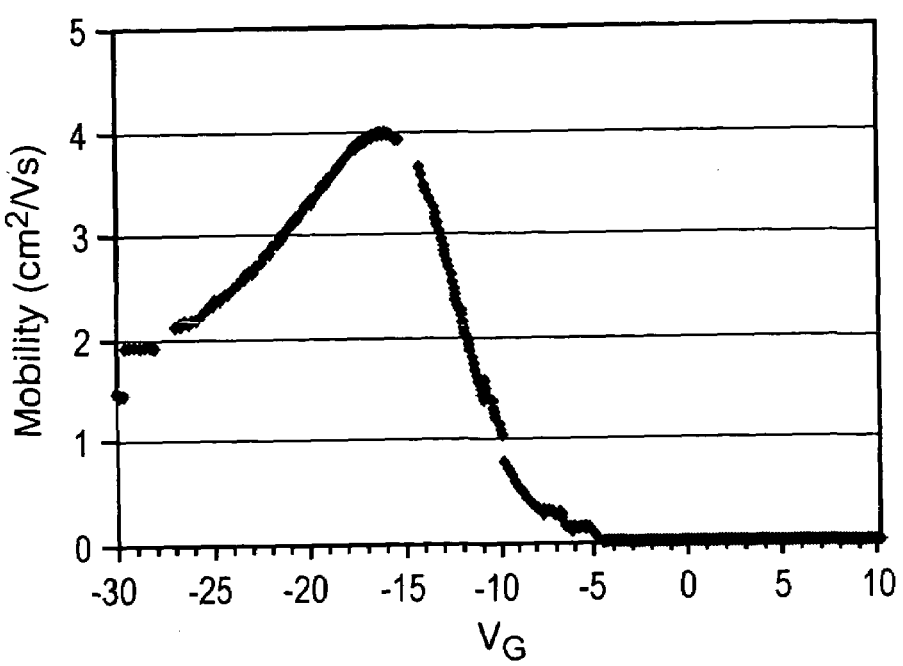
FIG. 3 is a graph showing the charge mobility of a device fabricated according to Example 1 of the present invention.

Curves showing the current transfer characteristics and the charge mobility of the device were plotted using a KEITHLEY semiconductor characterization system (4200-SCS) (FIGS. 2 and 3). From the curves, the electrical properties of the device were calculated by the following equations, and the results are shown in Table 1 below.

The charge mobility of the device was calculated from the slope of the $(I_{SD})^{1/2}$-$V_G$ graph using the following current equation at the saturation region:

$$I_{SD} = \frac{WC_0}{2L}\mu(V_G - V_T)^2$$

$$\sqrt{I_{SD}} = \sqrt{\frac{\mu C_0 W}{2L}} (V_G - V_T)$$

$$\text{slope} = \sqrt{\frac{\mu C_0 W}{2L}}$$

$$\mu_{FET} = (\text{slope})^2 \frac{2L}{C_0 W}$$

where $I_{SD}$ is the source-drain current, $\mu$ or $\mu_{FET}$ is the charge mobility, $C_o$ is the capacitance of the oxide film, W is the channel width, L is the channel length, $V_G$ is a gate voltage, and $V_T$ is a threshold voltage.

Off-state leakage current ($I_{off}$) is a current flowing in the off-state, and was determined from the minimum current in the off-state in the current ratio.

Current ratio $I_{on}/I_{off}$ is the ratio of the maximum current value in the on-state to the minimum current value in the off-state.

COMPARATIVE EXAMPLE 1

Figure 4:
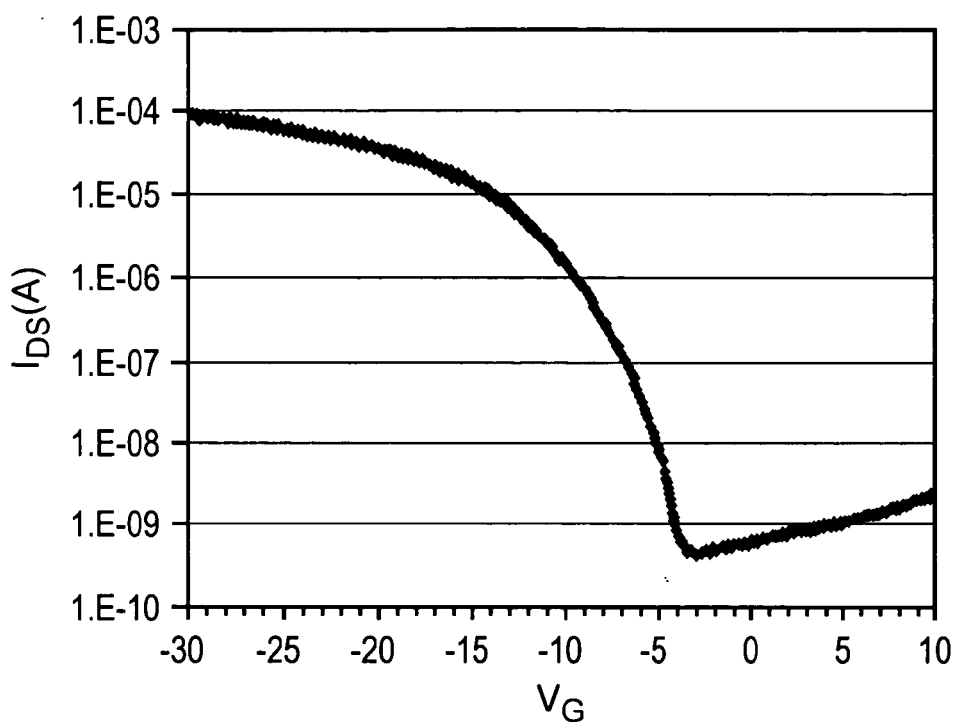
FIG. 4 is a graph showing the current transfer characteristics of a device fabricated according to Comparative Example 1 of the present invention.
Figure 5:
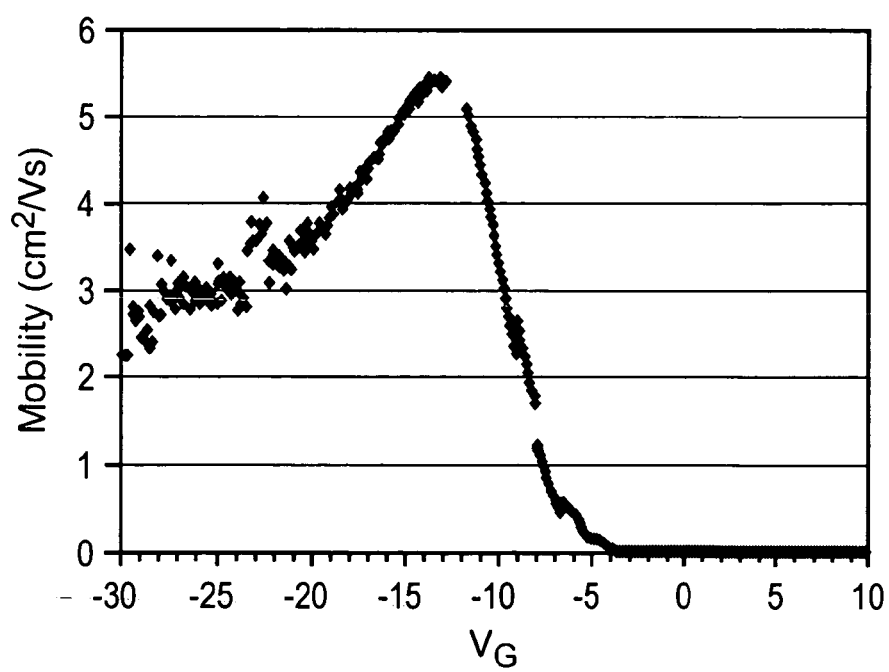
FIG. 5 is a graph showing the charge mobility of a device fabricated according to Comparative Example 1 of the present invention.

Fabrication of Device by Using Organic Insulator Containing No Crosslinking Agent A device was fabricated in the same manner as in Example 1, except that a coating solution containing no crosslinking agent and photoacid generator was used to coat an insulating film, and the insulating film was baked at 100° C. for 1 hour to fabricate a device. The current transfer characteristics and the charge mobility of the device were measured, and the results are shown in FIGS. 4 and 5. The electrical properties of the device were calculated in the same manner as in Example 1. The results are shown in Table 1 below.

TABLE 1

|  | Mobility ($cm^2/V_s$) | $I_{off}$ (A) | $I_{on}/I_{off}$ |
| --- | --- | --- | --- |
| Example 1 | 5.4 | $10^{-9} \sim 10^{-10}$ | $10^5$ |
| Comparative Example 1 | 4.3 | $10^{-10}$ | $10^5 \sim 10^6$ |

As apparent from the above description, since the organic insulating film of the present invention has excellent chemical resistance to organic solvents used in a subsequent photolithographic process, it can improve the electrical performance of transistors while enabling the formation of micropatterns.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A composition for forming an organic insulating film, comprising:
(i) an organic insulating polymer represented by Formula 1 or 2 below:

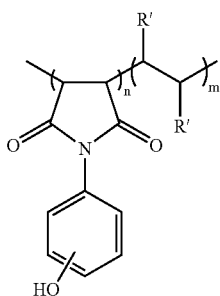

(1)

wherein substituents R' are each independently a hydrogen atom, a hydroxyl group, an ester group, an amide group, a $C_{1\sim12}$ alkyl or alkoxy group, a $C_{6\sim30}$ aromatic group, or a $C_{3\sim30}$ heteroaromatic group, and the aromatic or heteroaromatic group may be substituted with at least one group selected from hydroxyl, ester, amide, $C_{1\sim12}$ alkyl and alkoxy, and amine groups; n is a real number between 0.1 and 1; m is a real number between 0 and 0.9; and the sum of n and m is 1, or

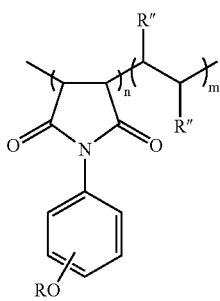

(2)

wherein R is a $C_{6\sim30}$ aromatic or $C_{3\sim30}$ heteroaromatic group, and the aromatic group and the heteroaromatic group may be substituted with at least one group selected from $C_{1\sim12}$ alkyl and alkoxy, and amine groups; substituents R" are each independently a hydrogen atom, a hydroxyl group, an ester group, an amide group, a $C_{1\sim12}$ alkyl or alkoxy group, a $C_{6\sim30}$ aromatic group or a $C_{3\sim30}$ heteroaromatic group, and the aromatic group and the heteroaromatic group may be substituted with at least one group selected from hydroxyl, ester, amide, $C_{1\sim12}$ alkyl and alkoxy, and amine groups, with the proviso that at least one R" is a hydroxyl group; n is a real number between 0.1 and 0.9; m is a real number between 0.1 and 0.9; and the sum of n and m is 1;
(ii) a crosslinking agent;
(iii) a photoacid generator; and
(iv) a solvent.

2. The composition according to claim 1, wherein the crosslinking agent is used in an amount of 10~80 parts by weight, and the photoacid generator is used in an amount of 0.1~10 parts by weight, based on 100 parts by weight of the organic insulating polymer.

3. The composition according to claim 1, wherein the crosslinking agent is at least one compound selected from the group consisting of polyacrylic acids, epoxy resins, phenol resins, melamine resins, organic acids, amine compounds and anhydrides.

4. The composition according to claim 1, wherein the photoacid generator is an ionic photoacid generator, non-ionic photoacid generator or polymeric photoacid generator.

5. The composition according to claim 1, wherein the photoacid generator includes an ionic photoacid generator that is selected from the group consisting of materials represented by Formulae 3 to 10 below:

(3)

wherein $R_1$, $R_2$ and $R_3$ are each independently a linear or branched $C_{1\sim6}$ alkyl, phenyl or substituted phenylalkyl group; X is a linear, branched or cyclic $C_{1\sim8}$ alkyl sulfonate, perfluoroalkyl sulfonate, naphthyl sulfonate, 10-camphor sulfonate, phenyl sulfonate, tolyl sulfonate, dichlorophenyl sulfonate, trichlorophenyl sulfonate, trifluoromethylphenyl sulfonate, Cl, Br, $SbF_6$, $BF_4$, $PF_6$ or $AsF_6$;

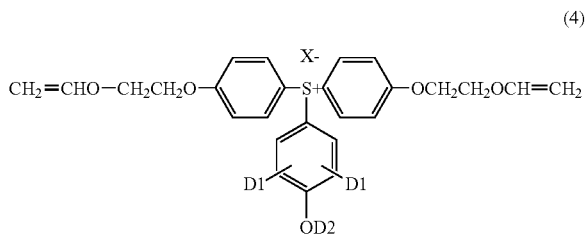

(4)

wherein X is a linear, branched or cyclic $C_{1\sim8}$ alkyl sulfonate, perfluoroalkyl sulfonate, naphthyl sulfonate, 10-camphor sulfonate, phenyl sulfonate, tolyl sulfonate, dichlorophenyl sulfonate, trichlorophenyl sulfonate, trifluoromethylphenyl sulfonate, F, Cl, Br, $SbF_6$, $BF_4$, $PF_6$ or $AsF_6$; D1 is a hydrogen atom or a $C_{1\sim4}$ alkyl group; and D2 is a $C_{1\sim10}$ alkyl or 2-vinyloxyethyl group;

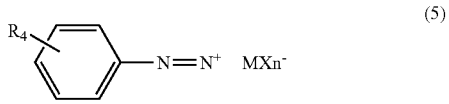

(5)

wherein $R_4$ is a $C_{1\sim10}$ alkyl group; and $MX_n^{31}$ is $BF_4^{31}$, $PF_6^-$, $AsF_6^{31}$ or $SbF_6^{31}$;

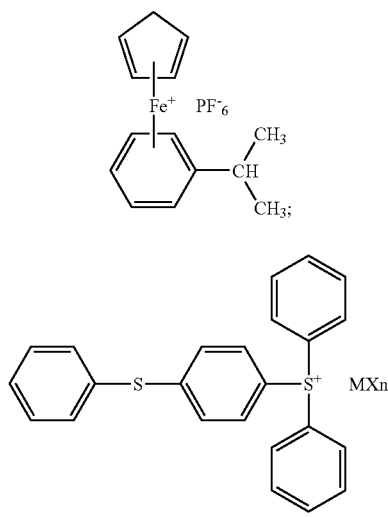

(6)

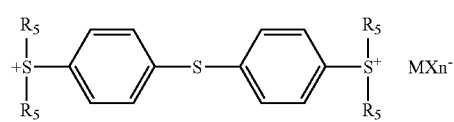

wherein MXn⁻ is PF₆⁻ or SbF₆⁻;

(7)

(8)

wherein $R_5$ is a $C_{1\sim10}$ alkyl group; and $MX_n^{31}$ is $PF_6^-$ or $SbF_6^-$;

(9)

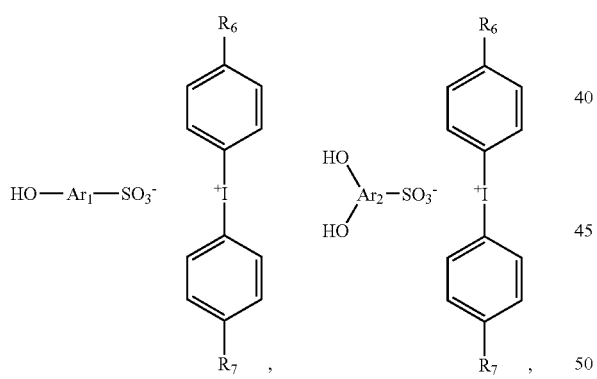

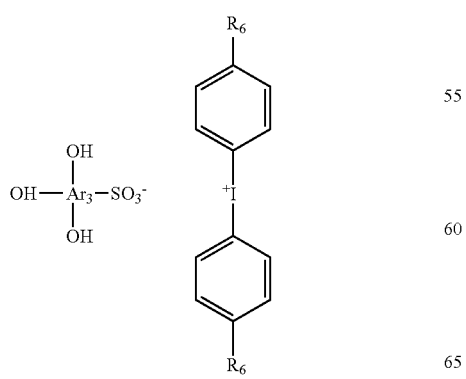

wherein $R_6$ and $R_7$ are each independently a $C_{1\sim20}$ alkyl or alkoxy group, or a hydroxyl group; and $Ar_1$, $Ar_2$ and $Ar_3$ are each independently a phenyl, naphthalenyl or anthracenyl group; and

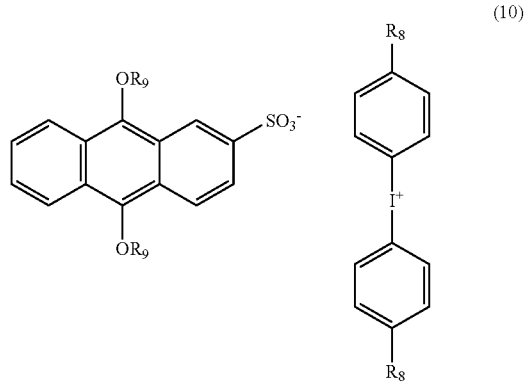

(10)

wherein $R_8$ and $R_9$ are each independently a $C_{1\sim20}$ alkyl or alkoxy group, or a hydroxyl group, the photoacid generator includes a non-ionic photoacid generator that is selected from the group consisting of materials represented by Formulae 11 to 17 below:

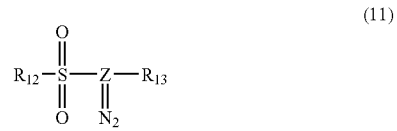

(11)

wherein $R_{12}$ and $R_{13}$ are each independently a linear, branched or cyclic $C_{1\sim10}$ alkyl group;

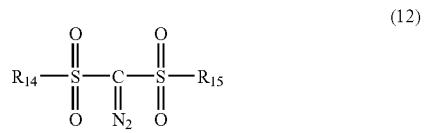

(12)

wherein $R_{14}$ is a hydrogen atom, a halogen atom, or a linear or branched $C_{1\sim5}$ alkyl, alkoxy group or a haloalkyl group; and $R_{1\sim5}$ is a linear, branched or cyclic $C_{1\sim10}$ alkyl, alkylphenyl or haloalkyl group;

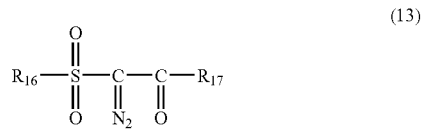

(13)

wherein $R_{16}$ is a hydrogen atom, a halogen atom, a linear or branched $C_{1\sim5}$ alkyl group, or a trifluoromethyl group; $R_{17}$ is a linear, branched or cyclic $C_{1\sim10}$ alkyl, alkyiphenyl or haloalkyl group, a phenylalkyl group, a linear or branched $C_{1\sim5}$ alkoxy group, a phenyl, or a tolyl group;

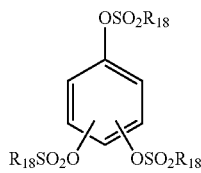
(14)

wherein $R_{18}$ is a group represented by Formula 14a or 14b below:

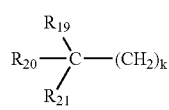
(14a)

wherein $R_{19}$, $R_{20}$ and $R_{21}$ are each independently a hydrogen or halogen atom; and k is an integer of 0 to 3; or

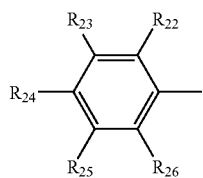
(14b)

wherein $R_{22}$ to $R_{26}$ are each independently a hydrogen atom, a halogen atom, a linear or branched $C_{1\sim 5}$ alkyl or alkoxy group, a trifluoromethyl group, a hydroxyl group, a trifluoromethoxy group or a nitro group;

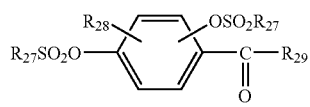
(15)

wherein $R_{27}$ is the group of Formula 14a or 14b above; $R_{28}$ is a hydrogen atom, a hydroxyl group or $R_{27}SO_2O$; and $R_{29}$ is a linear or branched $C_{1\sim 5}$ alkyl group, or a group represented by Formula 15a below:

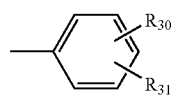
(15a)

wherein $R_{30}$ and $R_{31}$ are each independently a hydrogen atom, a linear or branched $C_{1\sim 5}$ alkyl group, or $R_{27}SO_2O$;

(17)

wherein $R_{32}$ is an alkyl or aryl group which may be interrupted by at least one heteroatom; and j is an integer from 1 to 3; and (17)

wherein $Q_1$ and $Q_2$ are each independently a $C_{1\sim 50}$ alkyl or aryl group, and both g and h are integers not less than 1, and/or the photoacid generator includes a polymeric photo-acid generator that is a polymer having a molecular weight of 500~1,000,000 and containing a sulfonium or iodonium salt in its backbone chain or side chain or an organic photoacid generator in the side chain.

6. The composition according to claim 1, wherein the solvent is used in such an amount that the solid content of the composition is in the range of 1~50% by weight.

7. An organic insulating film formed by coating the composition according to claim 1, followed by annealing and UV irradiation.

8. An organic thin film transistor comprising a substrate, a gate electrode, a gate insulating film, an organic active layer and source-drain electrodes wherein the gate insulating film is composed of the organic insulating film according to claim 7.

* * * * *